United States Patent [19]

Kaneno et al.

[11] Patent Number: 4,771,433
[45] Date of Patent: Sep. 13, 1988

[54] SEMICONDUCTOR LASER DEVICE

[75] Inventors: Nobuaki Kaneno; Kenji Ikeda, both of Itami, Japan

[73] Assignee: Mitsubishi Denki Kabushiki Kaisha, Tokyo, Japan

[21] Appl. No.: 943,931

[22] Filed: Dec. 19, 1986

[30] Foreign Application Priority Data

Dec. 20, 1985 [JP] Japan .................. 60-289034

[51] Int. Cl.$^4$ ............................... H01S 3/19
[52] U.S. Cl. ........................ 372/45; 372/46; 372/48; 372/96
[58] Field of Search ............ 372/46, 45, 48, 44, 372/43, 96

[56] References Cited

U.S. PATENT DOCUMENTS 4,624,000 12/1986 Streifer et al. .................. 372/48

OTHER PUBLICATIONS

Coleman et al., "Single-Longitudinal-Mode Metalorganic Chemical-Vapor-Deposition ...", Appl. Phys. Lett. 37(3), Aug. 1, 1980, pp. 262-263.

Primary Examiner—James W. Davie
Assistant Examiner—Georgia Y. Epps
Attorney, Agent, or Firm—Birch, Stewart, Kolasch & Birch

[57] ABSTRACT

A semiconductor laser device which includes a semiconductor substrate; a semiconductor active layer; a semiconductor waveguiding layer provided adjacent to the active layer having a larger energy band gap than that of the active layer; a first and a second semiconductor cladding layer provided such that the semiconductor waveguiding layer and the active layer are positioned between by the two cladding layers, which cladding layers have larger energy band gaps than that of the waveguiding layer; and a periodic refractive index distribution being provided in a direction parallel with the active layer inside a waveguide produced by the refractive index differences produced at the above-mentioned four layers.

22 Claims, 7 Drawing Sheets

SEMICONDUCTOR LASER DEVICE

FIELD OF THE INVENTION

The present invention relates to a semiconductor laser device capable of conducting a stabilized oscillation at a single transverse mode.

BACKGROUND ART

FIG. 8 shows a cross-sectional view of a prior art semiconductor laser device disclosed in Applied Physics Letters Vol. 37, No. 3 (1980) pp 262 to 263.

In FIG. 8, the reference numeral 1b designates an n type GaAs substrate having a flat surface, the numeral 2c designates an n type AlGaAs lower cladding layer grown on the substrate 1b, the numeral 4 designates an active layer, the numeral 5a designates a p type AlGaAs upper cladding layer, and the numeral 6 designates an n type GaAs current blocking layer having a groove of a stripe configuration. The numeral 7 designates a p type AlGaAs layer grown so as to embed the groove of the current blocking layer 6, the numeral 8 designates a p type GaAs contact layer, the numeral 9 designates an n electrode, and the numeral 10 designates a p electrode.

The device operates as follows.

The light generated at the active layer 4 is confined in the active layer 4 by the refractive index difference between the active layer 4 and the adjacent upper and lower cladding layers 2c and 5a. Furthermore, the broadening of the light in the direction parallel to the active layer 4, that is in the transverse direction, is restricted by the light absorption and the current confinement by the current blocking layer 6, and the light is guided thereby.

In the prior art semiconductor laser device with such a construction, the broadening of the light in the transverse direction is restricted by the light absorption and the current confinement of the n type GaAs current blocking layer 6, and a single transverse mode oscillation is obtained when the width of the stripe of the active region is less than 5 $\mu$m. Furthermore, when the injection current is increased, the refractive index distribution in the stripe varies slightly, and as a result there may arise fluctuation of the laser beam, and deviation of the current vs. light output characteristics caused by the straightness, kinks, and deviation of the peak of the far-field pattern.

SUMMARY OF THE INVENTION

An object of the present invention is to provide a semiconductor laser device capable of reducing the fluctuation of the laser beam, and providing a stable single transverse mode oscillation.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from this detailed description.

According to the present invention, there is provided a semiconductor laser device which includes a semiconductor substrate; a semiconductor active layer; a semiconductor waveguiding layer provided adjacent to the active layer having a larger energy band gap than that of the active layer; a first and a second semiconductor cladding layer provided such that the semiconductor waveguiding layer and the active layer are positioned between the two cladding layers, which cladding layers have larger energy band gaps than that of the waveguiding layer; and a periodic refractive index distribution being provided in a direction parallel with the active layer inside a waveguide produced by the refractive index differences produced at the above-mentioned four layers.

DETAILED DESCRIPTION OF THE PREFERRED EMBODIMENTS

Figure 1:
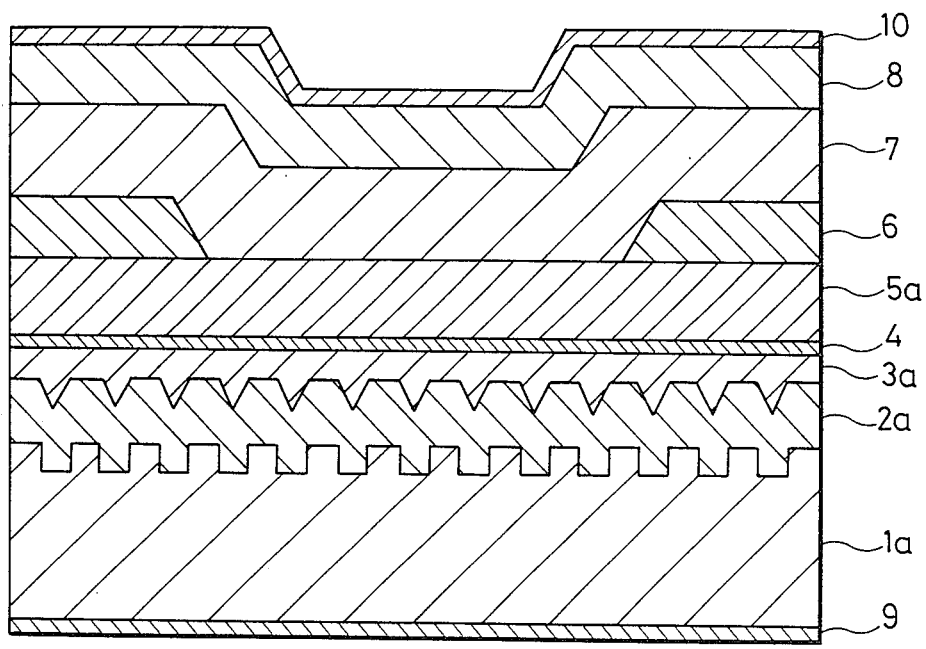
FIG. 1 is a cross-sectional view showing a semiconductor laser device as an embodiment of the present invention.

In order to explain the present invention in detail, reference will be particularly made to FIG. 1.

FIG. 1 shows a semiconductor laser device as an embodiment of the present invention. In FIG. 1, the reference numeral 1a designates an n type GaAs substrate on which a stripe shaped uneven structure comprising a periodic groove configuration with convex and concave portions is produced. The reference numeral 2a designates an n type AlGaAs lower cladding layer grown on the substrate 1a so as to maintain the groove configuration. The reference numeral 3a designates an n type AlGaAs waveguiding layer grown on the lower cladding layer 2a so as to embed the stripe shaped unevenness. This waveguiding layer 3a has an energy band gap smaller than that of the lower cladding layer 2a. The reference numeral 4 designates a GaAs active layer, the reference numeral 5a designates a p type AlGaAs upper cladding layer, the reference numeral 6 designates an n type GaAs current blocking layer having a groove with a stripe configuration, and the reference numeral 7 designates a p type AlGaAs layer grown on the current blocking layer 6 so as to embed the current blocking layer 6. This p type AlGaAs layer has the same Al composition as that of the upper cladding layer 5a. The reference numeral 8 designates a p type GaAs contact layer, the reference numeral 9 designates an n type electrode, and the reference numeral 10 designates a p type electrode.

The device will be operated as follows.

In the present embodiment, the refractive index difference between the active layer 4 and the adjacent upper cladding layer 5a, the waveguiding layer 3a, and the lower cladding layer 2a provided adjacent to the waveguiding layer 3a as well as the light absorption and the current confinement provided by the current blocking layer 6 produce a coupling waveguide. Thus, the light generated at the active layer 4 is guided by the coupling waveguide.

In this light waveguide, a periodic refractive index distribution in the direction parallel with the active layer 4, that is, in the transverse direction, is produced by the stripe type uneven surface produced periodically on the substrate 1a.

Figure 2A:
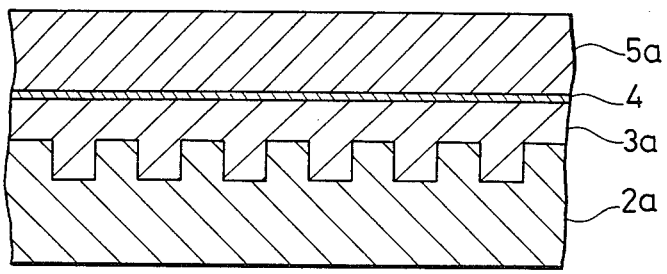
FIG. 2(a) and (b) are diagrams showing the calculation models for exemplifying the operation of the device of FIG. 1.
Figure 2B:
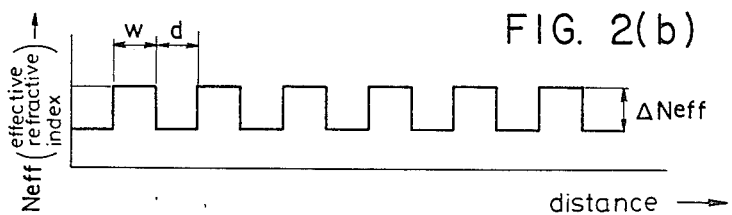
Figure 3:
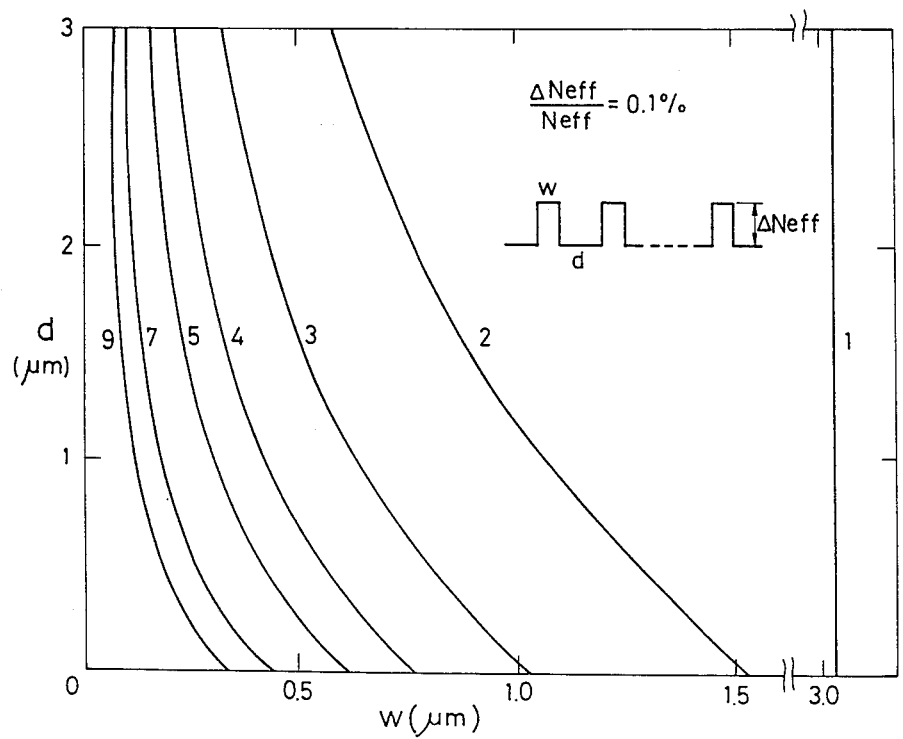
FIG. 3 is a diagram showing the regions which allow the fundamental mode oscillation obtained from the calculation with the use of the models shown in FIG. 2.

Herein, upon review of FIG. 1 of "High Power Phase-Locked Laser Array" presented on the 114th Conference (of May 21, 1985) of the Light Electricity Mutual Conversion 125th committee of the Japan Society for the Promotion of Science, the conditions for cutting off the fundamental mode when the refractive index difference-effective refractive index ratio in the transverse direction $\Delta$ Neff/Neff is 0.1% in the refractive index distribution model of FIG. 2(a) and (b) are shown in FIG. 3 as a function of the width w of the convex portion and the width d of the concave portions (distance between the convex portions) with a parameter of the number of the stripe type grooves. The regions inside the respective curves (at the left and lower sides of the curves) are regions of d and w which allow only the fundamental mode oscillation. In FIG. 3, when the number of the stripe type grooves is 9 a combination of d and w, for example, that of d=1.0 $\mu$m and w=0.12 $\mu$m exists in the region which allows only the fundamental mode oscillation, and the width of the lightguide then becomes $(1.0+0.12)\times 9 = 10.08$ $\mu$m. Thus, only the fundamental mode is allowed in this waveguide having a wide oscillating region of about 10 $\mu$m, and thus, a high output laser light is obtained due to the wide oscillating region.

In the present embodiment, a periodic stripe uneven surface is produced on a substrate, and a periodic refractive index distribution is produced in the waveguide in a direction parallel with the active layer, whereby only the fundamental mode oscillation is enabled, and there arises no variation in the refractive index even when the injection current is increased. Accordingly, the fluctuation of the laser beam is avoided, thereby enhancing the straightness of the current vs. light output power characteristics, and further providing for no deviation of the peak of the far-field pattern even if the light output power is increased.

Furthermore, in this embodiment, the width of the waveguide oscillating at a single transverse mode can be broadened wider than the prior art semiconductor laser device, thereby resulting in a high light output power.

Figure 4:
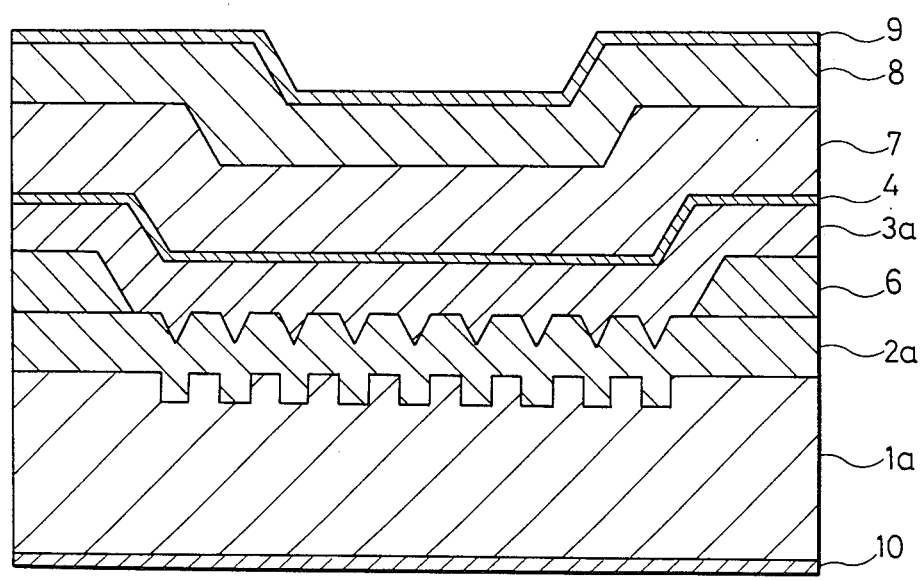
FIGS. 4, 5, 6, and 7 are cross-sectional views showing the other embodiments of the present invention, respectively.
Figure 5:
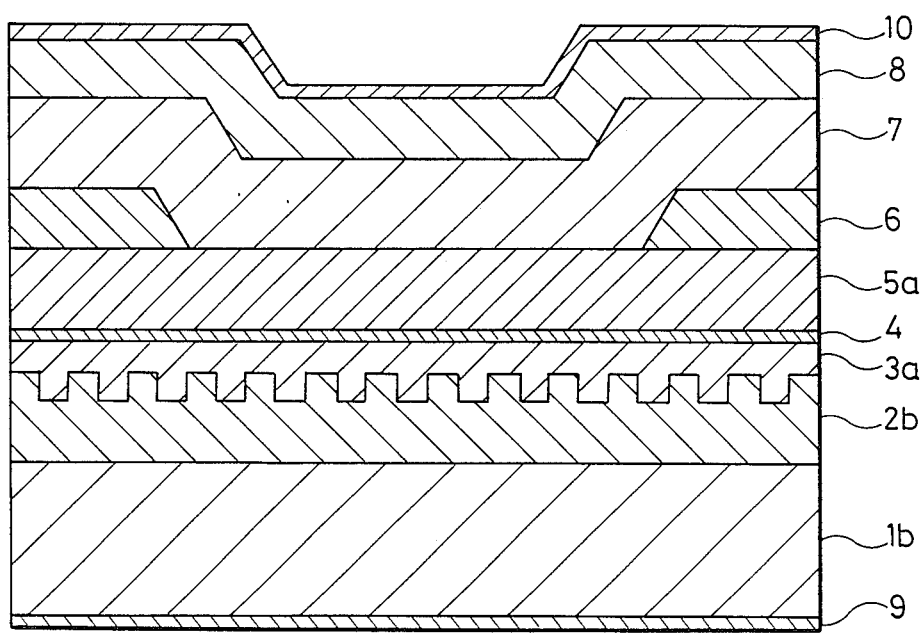

In the above illustrated embodiment, a periodic uneven surface is produced on the substrate 1a, and the blocking layer 6 is produced on the upper cladding layer 5a, but the blocking layer 6 can be produced on the lower cladding layer 2a as shown in FIG. 4. Furthermore, the periodic uneven surface can be produced on the upper surface of the lower cladding layer 2b as shown in FIG. 5.

Figure 6:
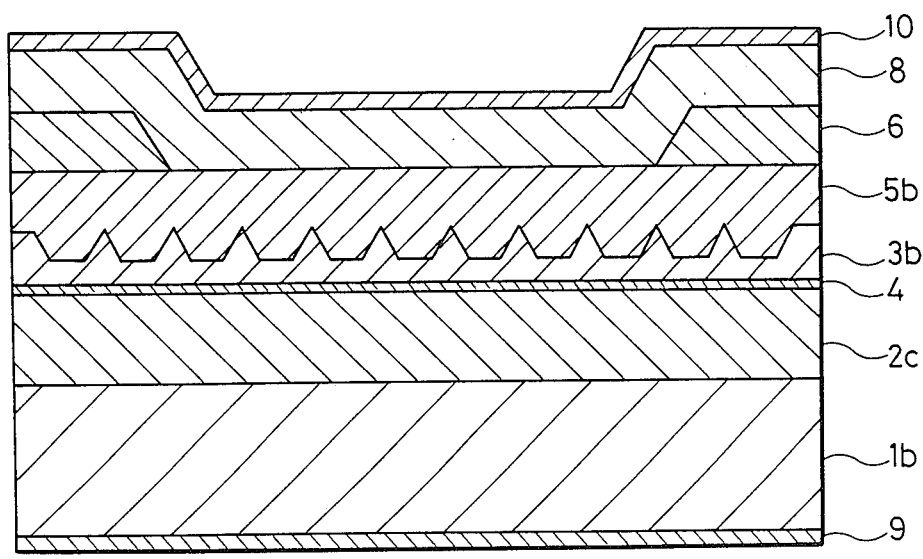

In the above illustrated embodiment, the lower cladding layer 2a has a periodic uneven structure, but the periodic uneven structure can be produced at the waveguiding layer 3b which is provided between the active layer 4 and the upper cladding layer 5b as shown in FIG. 6.

In the above illustrated embodiments, an n type GaAs layer is used as the current blocking layer 6, but an n type AlGaAs layer having a larger energy band gap than that of the upper cladding layer 5a can be used as a current blocking layer 6 with the same effects as described above.

Figure 7:
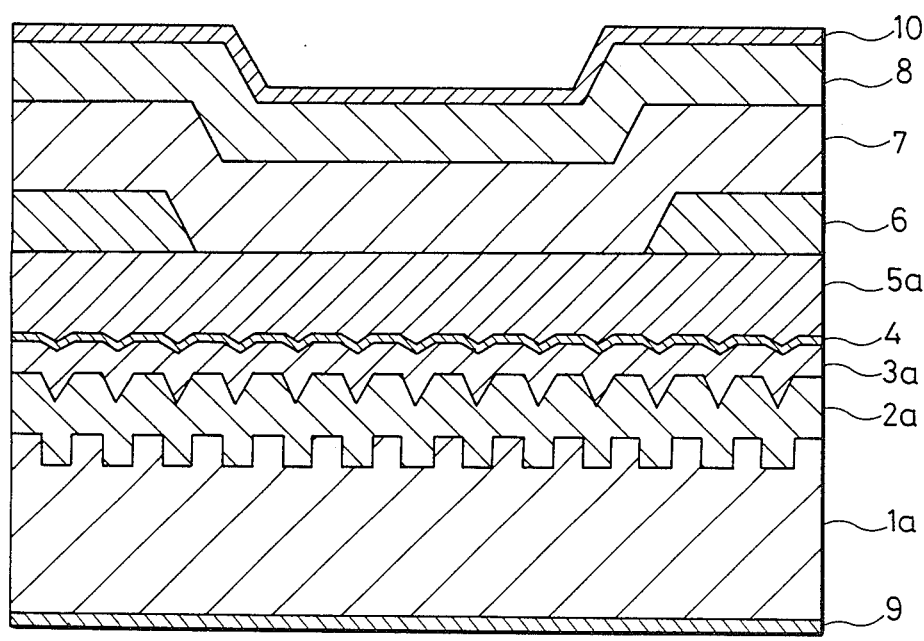
Figure 8:
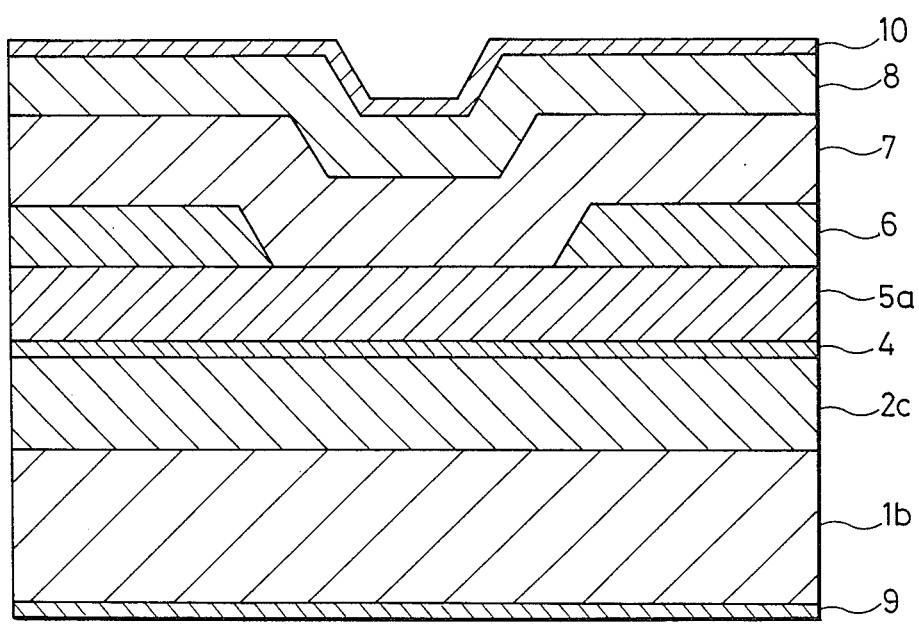
FIG. 8 is a cross-sectional view showing a prior art semiconductor laser device.

In the above illustrated embodiments, the active layer 4 has a flat structure, but the active layer may have an uneven structure shown in FIG. 7 with the same effects as the above described embodiments being obtained alone with the increase in the refractive index difference-effective refractive index ratio in the transverse direction ($\Delta$ Neff/Neff).

In the above illustrated embodiments, GaAs is used as the material of the active layer, but this active layer can be made of AlGaAs, or quaternary crystalline material such as AlGaInP or InGaAsP.

As is evident from the foregoing description, according to the present invention, a periodic refractive index distribution in the direction parallel with the active layer is provided with a waveguide, whereby the fundamental transverse mode oscillation at a wide waveguide is realized, and thus a high light output power is obtained.

What is claimed is:

1. A semiconductor laser device having an optical waveguide structure which comprises:
   a semiconductor substrate having a periodic groove stripe structure formed thereon;
   a first semiconductor cladding layer provided on said stripe structure of said substrate;
   a waveguide layer provided on said first cladding layer;
   an active layer provided on said waveguide layer, said active layer having an energy band gap smaller than that of said waveguide layer;
   a second semiconductor cladding layer provided on said active layer, wherein said first and said second cladding layers have an energy band gap larger than that of said waveguide layer;
   a current blocking layer provided on said second cladding layer, said current blocking layer having a groove formed therein so as to expose said second cladding layer; and
   an embedded layer provided on said current blocking layer so as to embed said current blocking layer, wherein said optical waveguide structure provides for a periodic refractive index distribution in a direction parallel with said active layer based on the refractive index differences of said layers.

2. A semiconductor laser device as defined in claim 1, wherein said first cladding layer has a periodic groove stripe structure.

3. A semiconductor laser device as defined in claim 2, wherein said stripe structure of said substrate is rectangular shaped, and wherein said stripe structure of said first cladding layer is V-shaped.

4. A semiconductor laser device as defined in claim 3 further comprising a contact layer provided on said embedding layer, and first and second electrodes provided on said contact layer and said substrate.

5. A semiconductor laser device as defined in claim 2, wherein said substrate comprises GaAs, said active layer comprises GaAs or AlGaAs, and said cladding layers and said waveguide layer comprise AlGaAs.

6. A semiconductor laser device as defined in claim 2, wherein said active layer comprises quaternary crystalline AlGaInP or InGaAsP.

7. A semiconductor laser device as defined in claim 2, wherein said active layer has a periodic groove stripe structure.

8. A semiconductor laser device as defined in claim 7, wherein said substrate comprises GaAs, said active layer comprises GaAs or AlGaAs, and said cladding layers and said waveguide layer comprise AlGaAs.

9. A semiconductor laser device as defined in claim 7, wherein said active layer comprises quaternary crystalline AlGaInP or InGaAsP.

10. A semiconductor laser device having an optical waveguide structure which comprises:
a semiconductor substrate having a periodic groove stripe structure formed thereon;
a first semiconductor cladding layer provided on said stripe structure of said substrate;
a current blocking layer provided on said first cladding layer, said current blocking layer having a groove formed therein so as to expose said first cladding layer;
a waveguide layer provided on said current blocking layer, said waveguide layer having an energy band gap smaller than that of said first cladding layer;
an active layer provided on said waveguide layer, said active layer having an energy band gap smaller than that of said waveguide layer; and
an embedding layer formed on said active layer, wherein said optical waveguide structure provides for a periodic refractive index distribution in a direction parallel with said active layer based on the refractive index differences of said layers.

11. A semiconductor laser device as defined in claim 10, wherein said first cladding layer has a periodic groove stripe structure.

12. A semiconductor laser device as defined in claim 11, wherein said stripe structure of said substrate is rectangular shaped, and wherein said stripe structure of said first cladding layer is V-shaped.

13. A semiconductor laser device as defined in claim 11, wherein said substrate comprises GaAs, said active layer comprises GaAs or AlGaAs, and said cladding layers and said waveguide layer comprise AlGaAs.

14. A semiconductor laser device as defined in claim 11, wherein said active layer comprises quaternary crystalline AlGaInP or InGaAsP.

15. A semiconductor laser device having an optical waveguide structure comprising:
a semiconductor substrate;
a first semiconductor cladding layer provided on said substrate, said first cladding layer having a periodic groove stripe structure formed thereon;
a waveguide layer provided on said stripe structure of said first cladding layer;
an active layer provided by said waveguide layer, said active layer having an energy band gap smaller than that of said waveguide layer;
a second semiconductor cladding layer provided on said active layer, wherein said first and said second cladding layers have an energy band gap larger than that of said waveguide layer;
a current blocking layer provided on said second cladding layer, said current blocking layer having a groove formed therein so as to expose said second cladding layer;
an embedding layer provided on said current blocking layer so as to embed said current blocking layer, wherein said optical waveguide structure provides for a periodic refractive index distribution in a direction parallel with said active layer based on the refractive index differences of said layers.

16. A semiconductor laser device as defined in claim 15, further comprising a contact layer provided on said embedding layer, and first and second electrodes provided on said contact layer and said substrate.

17. A semiconductor laser device as defined in claim 15, wherein said substrate comprises GaAs, said active layer comprises GaAs or AlGaAs, and said cladding layers and said waveguide layer comprise AlGaAs.

18. A semiconductor laser device as defined in claim 15, wherein said active layer comprises quaternary crystalline AlGaInP or InGaAsP.

19. A semiconductor laser device having an optical waveguide structure which comprises:
a semiconductor substrate;
a first semiconductor cladding layer provided on said substrate;
an active layer provided on said first cladding layer;
a waveguide layer provided on said active layer, said waveguide layer having a periodic groove stripe structure formed thereon and having an energy band gap larger than that of said active layer;
a second semiconductor cladding layer provided on said stripe structure of said waveguide layer, wherein said first and said second cladding layers have an energy band gap larger than that of said waveguide layer;
a current blocking layer provided on said second cladding layer, said current blocking layer having a groove formed therein, wherein said optical waveguide structure provides for a periodic refractive index distribution in a direction parallel with said active layer based on the refractive index differences of said layers.

20. A semiconductor laser device as defined in claim 19, further comprising a contact layer provided on said current blocking layer, and first and second electrodes provided on said contact layer and said substrate.

21. A semiconductor laser device as defined in claim 19, wherein said substrate comprises GaAs, said active layer comprises GaAs or AlGaAs, and said cladding layers and said waveguide layer comprise AlGaAs.

22. A semiconductor laser device as defined in claim 19, wherein said active layer comprises quaternary crystalline AlGaInP or InGaAsP.

* * * * *